(12) United States Patent
Abdesselam

(10) Patent No.: US 12,341,499 B2
(45) Date of Patent: Jun. 24, 2025

(54) HIGH-IMMUNITY, SELF-PROTECTED AND BIDIRECTIONAL ISOLATED CONTROLLER WITHOUT ANY COMPLEX COMPONENT

(71) Applicant: THALES, Courbevoie (FR)

(72) Inventor: Francis Abdesselam, Chatou (FR)

(73) Assignee: THALES, Courbevoie (FR)

( * ) Notice: Subject to any disclaimer, the term of this patent is extended or adjusted under 35 U.S.C. 154(b) by 150 days.

(21) Appl. No.: 17/864,278

(22) Filed: Jul. 13, 2022

(65) Prior Publication Data
US 2023/0014264 A1      Jan. 19, 2023

(30) Foreign Application Priority Data

Jul. 13, 2021   (FR) ...................................... 2107579

(51) Int. Cl.
*H03K 17/082*    (2006.01)
*G01R 19/165*    (2006.01)
(Continued)

(52) U.S. Cl.
CPC ..... *H03K 17/082* (2013.01); *G01R 19/16571* (2013.01); *G01R 31/52* (2020.01); *G01R 31/27* (2013.01)

(58) Field of Classification Search
CPC .... H03K 17/18; H03K 17/082; H03K 17/691; H02M 3/335; H02M 1/32; H02M 1/08;
(Continued)

(56) References Cited

U.S. PATENT DOCUMENTS 4,685,020 A      8/1987   Driscoll et al.
5,900,683 A  *   5/1999   Rinehart ............... H03K 17/567
                                                              307/129
(Continued)

FOREIGN PATENT DOCUMENTS

CN        101323310 B  * 12/2010
CN        105262056 A  *  1/2016
(Continued)

OTHER PUBLICATIONS

Machine translation of Deng et al. Chinese Patent Document CN 101323310 B Dec. 2010 (Year: 2010).*
(Continued)

*Primary Examiner* — Kevin J Comber
(74) *Attorney, Agent, or Firm* — BakerHostetler

(57) ABSTRACT

A power stage includes a control device and a power transistor, the control device comprising a primary circuit comprising: a control module able to generate a control current, a primary circuit malfunction detector able to detect a malfunction, a pulse transformer comprising a primary winding connected to the primary circuit, comprising a secondary winding connected to the secondary circuit, magnetically coupled to the primary winding and able to generate, from the control current, an induced pulse current making it possible to drive the power transistor, a secondary circuit comprising: a power and fault detection controller able to detect a malfunction of the secondary circuit or of the power transistor, the power and fault detection controller being able to communicate the malfunction of the secondary circuit or of the power transistor to the primary circuit malfunction detector.

12 Claims, 2 Drawing Sheets

(51) Int. Cl.
*G01R 31/52* (2020.01)
*G01R 31/27* (2006.01)

(58) Field of Classification Search
CPC .. G01R 19/16571; G01R 31/62; G01R 31/52; G01R 31/54; G01R 31/27
USPC .......................................................... 361/101
See application file for complete search history.

(56) References Cited

U.S. PATENT DOCUMENTS

| 2005/0062433 | A1* | 3/2005 | Ongaro | H05B 41/3922 |
| | | | | 315/312 |
| 2020/0083813 | A1* | 3/2020 | Tang | H02M 3/33523 |
| 2020/0169179 | A1* | 5/2020 | Hara | H02M 1/38 |

FOREIGN PATENT DOCUMENTS

| EP | 2 961 067 A1 | 12/2015 |
| EP | 3 621 192 A1 | 3/2020 |
| FR | 3 077 912 A1 | 8/2019 |

OTHER PUBLICATIONS

Machine translation of Cao et al. Chinese Patent Document CN 105262056 A Jan. 2016 (Year: 2016).*

* cited by examiner

HIGH-IMMUNITY, SELF-PROTECTED AND BIDIRECTIONAL ISOLATED CONTROLLER WITHOUT ANY COMPLEX COMPONENT

CROSS-REFERENCE TO RELATED APPLICATION

This application claims priority to foreign French patent application No. FR 2107579, filed on Jul. 13, 2021, the disclosure of which is incorporated by reference in its entirety.

FIELD OF THE INVENTION

The field of the invention is that of power electronics module controllers for driving the operation of power electronics components. As is known, power modules represent electronic components that handle high powers and therefore require particular attention in terms of their design and their monitoring over the course of their service life and use.

BACKGROUND

A power module controller is thus generally used so as to be able to exert an influence on the power module in the event of malfunctioning or failure of the module, unusual operation or even so as to make it possible to target precise operation of the power module. However, it is nowadays necessary to be able to isolate this controller from the power module so as to be able to protect the controller from any malfunction of the power module.

More specifically, some fields, such as aeronautics, stipulate standards to be complied with for electronic components. Thus, by way of indication, standard D0-254 stipulates the safety conditions applicable to critical electronic components of the avionics in commercial aviation and general aviation. This standard stipulates notably development constraints linked to obtaining certification for an avionics electronic component. There is thus nowadays the requirement, for any power module used in aeronautics, to be controlled by way of a control means isolated from the module.

Usually, the control function isolated from the power module is implemented in line with the following principles:

A controller isolated by an optocoupler. An optocoupler, or also called photocoupler, is an electronic component capable of transmitting a signal from one electrical circuit to another, without there being any galvanic contact between them. The optocoupler thus has the advantage of allowing isolation between the controller and the power module so as to protect the controller. However, the use of a controller based on the optocoupler is at present a component deemed to be unreliable and is barred in some fields of use, such as the field of aeronautics for example. Specifically, a controller based on the use of the optocoupler might not transmit the whole of an optical signal, for example, and exhibit losses that lead to the loss of sometimes essential information. In addition, the use of this type of technology leads to the use of electronic components with a relatively low service life for requirements in the field of civil aeronautics, which may exceed 250,000 usage hours for any electronic component.

A controller isolated by a pulse transformer with a magnetic circuit. The pulse transformer has the advantage, over the optocoupler, of being able to operate at a high frequency, of being very simple to install and of having the ability to supply a high current. However, a pulse transformer with a magnetic circuit only allows operation in AC mode and only for short commands. An isolated controller using a pulse transformer with a magnetic circuit thus does not allow the transmission of DC commands.

A controller isolated by a transformer without a magnetic circuit. However, in the same way as for pulse transformers with a magnetic circuit, it is possible to work only with short pulses.

A controller isolated by a piezoelectric transformer. Specifically, the deformation of a certain type of material makes it possible to generate a voltage. It is therefore conceivable to deform the material in a defined manner so as to generate the correct voltage in order to influence the power module. However, the power that is supplied remains relatively low in comparison with the other transformers for a structure requiring the use of complex and costly components.

Finally, a controller based on capacitive isolation nowadays has highly beneficial isolation capabilities. However, this type of technology comprises complex components and therefore requires a relatively high degree of certification in comparison with components for the other types of controller.

Furthermore, the majority of isolation technologies presented above operate unidirectionally. Specifically, the controller for the power module makes it possible to control the module by giving instructions in the direction of the module. Thus, in order to obtain bidirectionality of the communication between a power module and its controller, it becomes necessary to add components to the controller, thus increasing the overall cost thereof and impacting the compactness of the controller.

SUMMARY OF THE INVENTION

The invention aims to overcome all or some of the abovementioned problems by proposing a simple power module controller, isolated from the controlled module and allowing bidirectional operation, that is to say by controlling the module and by receiving information linked to the operation of the power module.

To this end, the subject of the invention is a power stage comprising a control device and a power transistor connected to the control device in order to be driven by the control device, the control device comprising:

A primary circuit and a secondary circuit, the primary circuit comprising:
A control module able to generate a control current $i_t$,
a primary circuit malfunction detector able to detect a malfunction of the primary circuit,
A pulse transformer comprising a primary winding connected to the primary circuit, the pulse transformer comprising a secondary winding connected to the secondary circuit, magnetically coupled to the primary winding and able to generate, from the control current $i_t$, an induced pulse current $i_m$ in the direction of the secondary circuit, the induced pulse current $i_m$ making it possible to drive the power transistor,
the secondary circuit comprising:
A power and fault detection controller, connected to the secondary winding of the pulse transformer and to the power transistor, able to detect a malfunction of the secondary circuit and/or of the power transistor,
the power and fault detection controller being able to communicate the malfunction of the secondary circuit and/or of the power transistor to the primary circuit malfunction detector.

According to one aspect of the invention, the power and fault detection controller communicates the malfunction of the secondary circuit and/or of the power transistor to the primary circuit malfunction detector only by way of the pulse transformer.

According to one aspect of the invention, the full bridge is configured to synchronously generate the control current $i_t$ on the basis of the external control signal and/or the predefined pulsed wave.

According to one aspect of the invention, the control module comprises an oscillator able to generate a predefined pulsed wave on the basis of a control signal originating from outside the power stage and a full bridge, connected to the oscillator, able to generate the control current $i_t$ on the basis of the predefined pulsed wave in the direction of the primary winding of the pulse transformer.

According to one aspect of the invention, the secondary winding comprises two electrical terminals, the power and fault detection controller comprising an impedance connected to the two electrical terminals of the secondary winding of the pulse transformer, the impedance comprising an electrical resistance of less than 1000 ohms.

According to one aspect of the invention, the primary circuit malfunction detector comprises a short-circuit detector, the short-circuit detector being able to detect an overcurrent in the primary circuit.

According to one aspect of the invention, the short-circuit detector is able to detect an opening fault in the primary circuit and/or a short-circuit fault in the primary circuit.

According to one aspect of the invention, the power and fault detection controller comprises a pulse detector able to detect a pulse fault in the induced pulse current $i_m$.

According to one aspect of the invention, the pulse detector is configured to rectify the induced pulse current $i_m$.

According to one aspect of the invention, the power and fault detection controller comprises a power transistor operation detector, able to detect at least one parameter of the power transistor causing non-nominal operation of the power transistor.

According to one aspect of the invention, the power and fault detection controller comprises a stop element able to short-circuit the pulse transformer on the basis of a fault detection.

According to one aspect of the invention, the power stage comprises a power transistor driver able to generate a command for the power transistor based on the induced pulse current $i_m$.

According to one aspect of the invention, the primary circuit malfunction detector comprises a recorder able to record the malfunction of the primary circuit and/or the malfunction of the secondary circuit and/or of the power transistor.

According to one aspect of the invention, the current driver comprises a command deactivator, configured to cancel the command for the power transistor when a primary circuit malfunction and/or secondary circuit malfunction and/or power transistor malfunction is detected.

BRIEF DESCRIPTION OF THE DRAWINGS

The invention will be better understood and other advantages will become apparent on reading the detailed description of one embodiment that is given by way of example, which description is illustrated by the appended drawing, in which.

For the sake of clarity, the same elements will bear the same references throughout the figures.

DETAILED DESCRIPTION

Figure 1:
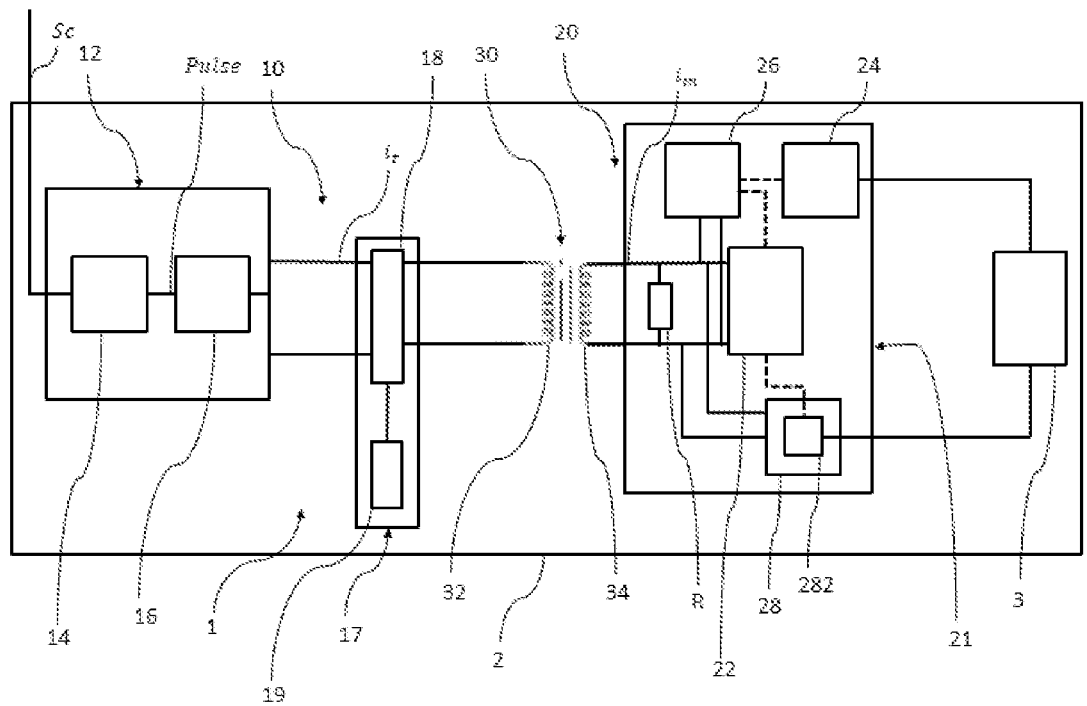
FIG. 1 shows a control device for the isolated and bidirectional control of a power stage, according to the invention.

FIG. 1 shows a power stage 2 comprising a control device 1 and a power transistor 3 connected to the control device 1 in order to be driven by the control device 1.

The control device 1 comprises a primary circuit 10 and a secondary circuit 20. The primary circuit 10 comprises:
a control module 12 able to generate a control current $i_t$,
a primary circuit malfunction detector 17 able to detect a malfunction of the primary circuit 10, that is to say non-nominal operation of the primary circuit 10.

The control device 1 also comprises a pulse transformer 30 comprising a primary winding 32 connected to the primary circuit 10 and a secondary winding 34 connected to the secondary circuit 20, magnetically coupled to the primary winding 32 and able to generate, from the control current $i_t$, an induced pulse current $i_m$ in the direction of the secondary circuit 20. The induced pulse current $i_m$ makes it possible to drive the power transistor 3. Specifically, the primary winding 32, flowed through by the control current $i_t$, makes it possible to create an electromagnetic field between the first winding 32 and the second winding 34 and magnetic induction at the second winding 34 so as to generate the induced pulse current $i_m$, which is a current comprising pulses representative of the pulses able to be observed in the control current $i_t$.

The secondary circuit 20, which is connected to the power transistor 3, comprises a power and fault detection controller 21 connected to the secondary winding 34 of the pulse transformer 30, on the one hand, and to the power transistor 3, on the other hand, able to detect a malfunction of the secondary circuit 20 and/or of the power transistor 3, that is to say non-nominal operation of the secondary circuit 20 and/or non-nominal operation of the power transistor 3.

The power and fault detection controller 21 is able to communicate the malfunction of the secondary circuit 20 to the primary circuit malfunction detector 17. In the same way, the power and fault detection controller 21 is able to communicate the malfunction of the power transistor 3 to the primary circuit malfunction detector 17.

The communication between the power and fault detection controller 21 and the primary circuit malfunction detector 17 has the advantage of allowing bidirectional operation of the controller between the control device 1 and the power transistor 3 of the power stage 2. Specifically, the communication may then take place by way of the control link between the control device 1 and the power transistor 3 such that the control device 1 exerts an influence on the power transistor 3. And, advantageously, this communication may also make it possible, by way of the communication between the power and fault detection controller 21 and the primary circuit malfunction detector 17, to inform the control device 1 about any operating state of the power transistor 3, or even allow the control device 1 to obtain a feedback of operating information from the control device 1 itself. More specifically, the communication between the power and fault detection controller 21 and the primary circuit malfunction detector 17 takes place by way of the pulse transformer 30, which has the advantage of limiting the number of components needed for this communication between primary circuit 10 and secondary circuit 20.

Figure 2:
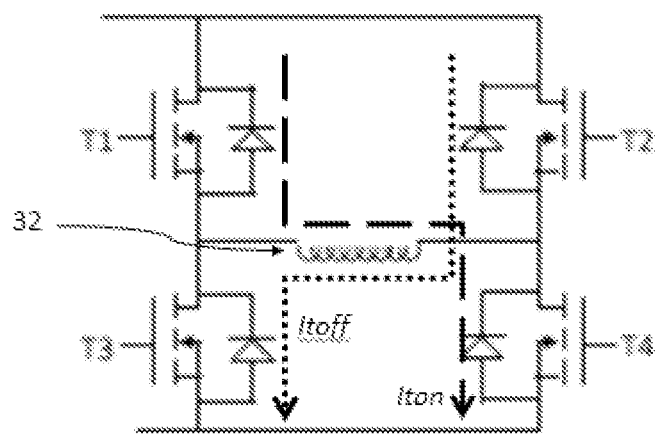
FIG. 2 shows a full-bridge architecture according to the invention.
Figure 3:
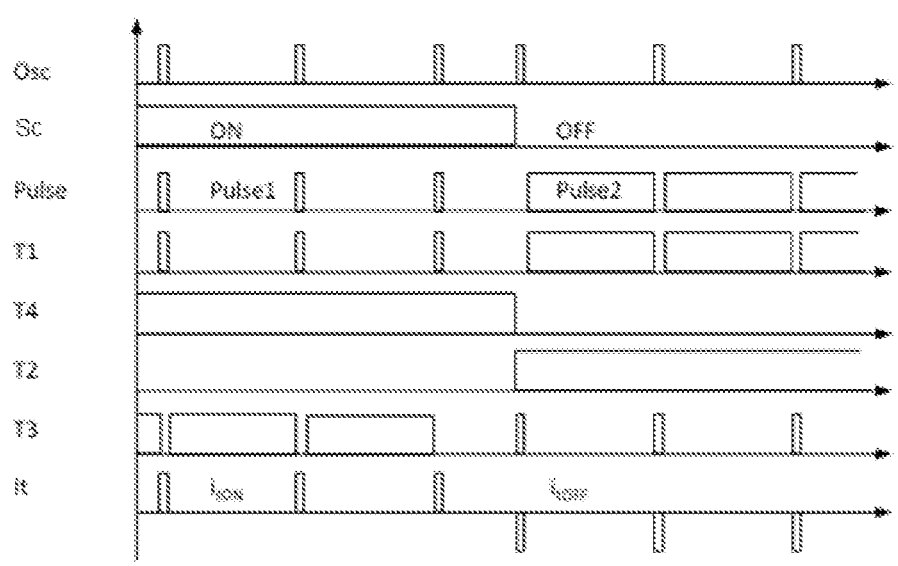
FIG. 3 is a timing diagram showing the combination of the control signal and of the pulsed wave and of the consequence on the full bridge according to the invention.

Advantageously, the control module 12 comprises:

an oscillator 14 able to generate a predefined pulsed wave Pulse on the basis of a control signal Sc originating from outside the power stage 2. More specifically, the oscillator 14 is able to generate a pulsed wave Pulse repeatedly at a frequency greater than 100 kilohertz. In addition, preferably, the pulsed wave Pulse may be repeated at a frequency of around 500 kilohertz, that is to say with a period of 2 μs. Thus, when the control module 12 receives an external activation control signal $Sc_{on}$ outside the power stage 2, the oscillator 14, in accordance with the external activation control signal $Sc_{on}$, generates a pulsed activation wave Pulse1. By contrast, when the control module 12 receives an external stop control signal $Sc_{off}$ outside the power stage 2, the oscillator 14, in accordance with this stop control signal $Sc_{off}$, generates a pulsed stop wave Pulse2. By way of indicative example, the pulsed activation wave Pulse1 may be a square-wave pulse, for which a transmission time of the high pulse lasts 200 nanoseconds and for which a transmission time of the low pulse lasts 1.8 microseconds. Similarly, the pulsed stop wave Pulse2 may be a square-wave pulse, for which the transmission time of the high pulse lasts 1.8 microseconds and for which the transmission time of the low pulse lasts 200 nanoseconds. However, by way of indication, the transmission time of the high pulse and of the low pulse of the pulsed wave Pulse may be between 20 microseconds and 10 nanoseconds. In addition, when the external control signal Sc is modified, by changing from an external activation control signal $Sc_{on}$ to an external stop control signal $Sc_{off}$ for example or else by changing from an external stop control signal $Sc_{off}$ to an external activation control signal $Sc_{on}$, the oscillator 14 is reset so as to generate the pulsed wave Pulse in accordance with the modification of the external control signal Sc.

a full bridge 16, connected to the oscillator 14, able to generate the control current $i_t$ on the basis of the predefined pulsed wave Pulse in the direction of the pulse transformer 30. The full bridge 16 conventionally comprises, as shown in FIG. 2, a first transistor T1 and a third transistor T3 that are connected, by way of the primary winding 32, to a second transistor T2 and to a fourth transistor T4. The first transistor T1 along with the third transistor T3 thus form a first half-bridge that is placed in parallel with a second half-bridge represented by the second transistor T2 and by the fourth transistor T4. Thus, when the oscillator 14 transmits a pulsed activation wave Pulse1, as shown in FIG. 3, the full bridge 16 generates an activation control current $i_{ton}$ at the terminals of the primary winding 32 in the direction of the transformer 30. And, similarly, when the oscillator 14 transmits a pulsed stop wave Pulse2, the full bridge 16 generates a stop control current $i_{toff}$ at the terminals of the primary winding 32 in the direction of the transformer 30. The control current $i_t$, thus comprises representative pulses so as to be an electrical image of the external control signal Sc through the knowledge of the pulsed wave Pulse.

It should be noted that the activation control current $i_{ton}$ flowing through the primary winding 32 may be a current with repeated positive pulses and that the stop control current $i_{toff}$ flowing through the primary winding 32 may be a current with repeated negative pulses, as shown in FIG. 3, or vice versa. The generation of the activation control current $i_{ton}$ and/or of the stop control current $i_{toff}$ is cyclic and is advantageously synchronous with respect to the external control signal Sc and to the pulsed wave Pulse. In other words, upon a change from a stop control current $i_{toff}$ to an activation control current $i_{ton}$, or vice versa, the cyclic generation of the new current, specifically the activation control current $i_{ton}$, is regenerated, by way of resetting the oscillator 14, so as not to have any delay between the new command caused by the new control current and the implementation of the power transistor 3 in response to this new command, specifically the activation thereof.

By way of indicative example, the delay between the new command caused by the new control current and the implementation of the power transistor 3 in response to this new command is less than one hundred nanoseconds.

The full bridge 16 is therefore configured to synchronously generate the control current $i_t$ on the basis of the external control signal Sc and/or of the predefined pulsed wave Pulse in the direction of the pulse transformer 30. In other words, the full bridge 16 is able to synchronously generate a train of positive pulses or activation control current $i_{ton}$ upon receipt of an external activation control signal $Sc_{on}$ and/or of a pulsed activation wave Pulse1 and a train of negative pulses or stop control current $i_{toff}$ upon receipt of an external stop control signal $Sc_{off}$ and/or of a pulsed stop wave Pulse2.

This configuration of placing the oscillator 14 and the full bridge 16 in series has the advantage of making it possible to transform a DC command into an AC signal able to be transmitted by the transformer 30. For example, the power transistor 3 may be a power switch. The command Sc is a binary signal in which the high level corresponds to the closing of the switch and the low level corresponds to the opening of the switch. The presence of the oscillator 14 and of the full bridge 16 transforms the high level of the external control signal Sc, reflecting an activation command for example, into a train of positive pulses $i_{ton}$. By contrast, the low level of the external control signal Sc, reflecting for example a stop command, is transformed into a train of negative pulses $i_{toff}$.

The power and fault detection controller 21 comprises an impedance R connected between the electrical terminals of the secondary winding 34 of the pulse transformer 30. The impedance R comprises an electrical resistance of less than 200 ohms. The impedance comprises an electrical resistance of less than one kiloohm and greater than fifty ohms. This closed-loop configuration between the secondary winding 34 and the impedance R has the advantage of limiting the magnetic susceptibility of the control device 1 and of immunizing it against any electromagnetic interference outside the power stage 2 by ensuring a flow of a high electric current in this closed loop. In other words, the link between the transformer 30 and the impedance R forms a low-impedance line. As a preferred example, the impedance R comprises an electrical resistance of 200 ohms.

As explained above, the primary circuit malfunction detector 17 is able to detect a malfunction in the primary circuit 10, that is to say any defect causing non-nominal operation in the primary circuit 10, and particularly in the full bridge 16. More specifically, the primary circuit malfunction detector 17 comprises a short-circuit detector 18, able to detect an overcurrent flowing in the primary circuit 10. For example, the short-circuit detector 18 is able to detect an opening fault in the primary circuit 10, that is to say opening of the electrical circuit of the primary circuit 10 or opening of the control line delivering the control signal Sc and/or a short-circuit fault in the primary circuit 10 and/or in the full bridge 16, that is to say a short circuit in the primary circuit or a short circuit in the full bridge 16.

Detecting an opening fault or a short-circuit fault thus makes it possible to increase the accuracy of the detection and to precisely ascertain the origin of the malfunction in the primary circuit 10.

Specifically, an opening fault or a short-circuit fault in the primary circuit 10 causes a significant increase in the control current $i_t$ and therefore an overcurrent in the primary circuit malfunction detector 17 and the short-circuit detector 18. By way of example, as soon as the short-circuit detector 18 detects a current greater than 100 milliamperes, the short-circuit detector 18 indicates the presence of an overcurrent and allows the primary circuit malfunction detector 17 to provide an alert with regard to the presence of a malfunction of the primary circuit 10 and an overall operating fault of the control device 1 of the power stage 2.

The primary circuit malfunction detector 17 may also comprise a recorder 19 able to record the malfunction of the primary circuit 10. The recorder 19 is connected to the short-circuit detector 18 so as to record the opening fault and/or the short-circuit fault in order to precisely record the cause that caused the malfunction of the primary circuit 10. The recorder 19 is also able to record the malfunction of the secondary circuit 20 and/or of the power transistor 3.

The recorder 19 thus makes it possible to record all previous malfunctions and blocking of the transmission of a command in order to avoid other potential malfunctions.

Advantageously, the power and fault detection controller 21 comprises:

A pulse detector 22 able to detect a pulse fault in the induced pulse current $i_m$. More specifically, the pulse detector 22 is able to detect the absence of a pulse in the induced pulse current $i_m$, reflecting the absence of a command transcribed by the transformer 30, or else by the full bridge 16 upstream of the power and fault detection controller 21. Thus, when the pulse detector 22 detects the absence of a pulse in the induced pulse current $i_m$, the power and fault detection controller 21 may provide information about the presence of an overall malfunction of the control device 1 of the power stage 2. Similarly, the pulse detector 22 is able to detect an irregularity in the pulses of the induced pulse current $i_m$, that is to say irregular pulse frequencies for example. A pulse fault may thus be interpreted as the absence of detected pulses or detection of irregular pulses in the induced pulse current $i_m$. The pulse detector 22 has the advantage of allowing precise targeting of the malfunction of the secondary circuit 20, specifically for example a fault in the transmission of information by the pulse transformer 30 for example. Furthermore, the pulse detector 22 is able to rectify the induced pulse current which is an AC current, following the induction thereof in the secondary winding 34 of the pulse transformer 30. This rectification has the advantage of converting the induced pulse current $i_m$ from an AC current to a DC current, then facilitating the detection of the pulses in the induced pulse current $i_m$.

A power transistor 3 operation detector 24, able to detect an operating fault of the power transistor 3. More specifically, the operation detector 24 is connected directly to the power transistor 3 so as to be able to detect at least one parameter of the power transistor 3 causing non-nominal operation of the power transistor 3, such as for example abnormal saturation of the power transistor 3. The operation detector 24 has the advantage of allowing precise targeting of the malfunction of the power transistor 3.

In addition, the power and fault detection controller 21 comprises a stop element 26 connected to the pulse detector 22 and to the power transistor 3 operation detector 24, able to short-circuit the secondary winding 34 of the transformer 30 on the basis of an anomaly detected by the power and fault detection controller 21. More specifically, in the event of a pulse fault in the induced pulse current $i_m$ detected by the pulse detector 22 and/or in the event of an operating fault of the power transistor 3 detected by the operation detector 24, the stop element 26 may short-circuit the secondary winding 34 of the pulse transformer 30. By way of example, the stop element 26 may be a switch connected in parallel with the secondary winding 34 and driven by the power and fault detection controller 21.

Now, when a short circuit occurs in the secondary circuit 20, an overcurrent then forms in the primary circuit 10. And, as explained above, this overcurrent is detected directly by the short-circuit detector 18 and the primary circuit malfunction detector 17, making it possible to provide an alert about an operating fault of the control device 1. The power and fault detection controller 21 is thereby able to communicate the malfunction of the secondary circuit 20 to the primary circuit malfunction detector 17 and also makes it possible to record the malfunction of the secondary circuit 20 and/or of the power transistor 3 detected by the power and fault detection controller 21 along with the cause of this malfunction by way of the recorder 19. The recorder 19 is thus able to record the malfunction of the primary circuit 10 and the malfunction of the secondary circuit 20.

An alert from the short-circuit detector 18 coupled with an alert from the operation detector 24 thus makes it possible, by way of indicative example, to highlight abnormal operation of the power transistor 3. An alert from the short-circuit detector 18 coupled with an alert linked to a pulse fault in the induced pulse current $i_m$ by the pulse detector 22 makes it possible, by way of indicative example, to highlight abnormal operation of the control device 1. And, an alert from the short-circuit detector 18 makes it possible, by way of indication, to highlight an electrical fault in the primary circuit 10 and particularly the full bridge 16.

The power and fault detection controller 21 is connected to a driver 28 for the power transistor 3 able to generate a command for the power transistor 3 based on the induced pulse current $i_m$. More specifically, the driver 28 is electrically connected to the electrical terminals of the secondary winding 34, and the driver 28 is also connected to the pulse detector 22 so as to generate a control link from the driver 28 via the pulse detector 22 and to the power transistor 3. The driver 28 is thus able to extract pulses from the induced pulse current $i_m$ and to generate a command for the power transistor 3. The communication between the driver 28 and the power transistor 3 is arbitrary and may, by way of non-exhaustive example, be electrical or optical. Preferably, the communication between the driver 28 and the power transistor 3 is electrical, as is the communication between the power transistor 3 and the operation detector 24. However, in the case of an electrical potential difference between the driver 28 and the power transistor 3, it is necessary to isolate the two components. The communication between the driver 28 and the power transistor may therefore be optical, as may the communication between the power transistor 3 and the operation detector 24.

The driver 28 of the power stage makes it possible to reconstruct, in-phase, that is to say with a delay less than 100 nanoseconds, the external control signal Sc received by the control module 12. The driver 28 thus has the advantage of having direct driving of the power transistor 3 on the basis of the command transmitted by the control device 1.

Furthermore, the current driver 28 comprises a command deactivator 282 able to cancel the command for the power transistor 3 generated by the driver 28. More specifically, the command deactivator 282 makes it possible to deactivate the control link between the control device 1 and the power transistor 3 when any fault or malfunction is detected. The command deactivator 282 thus has the advantage of making it possible, with a delay of less than 1 microsecond, to effectively deactivate the command from the control device 1 on the power transistor 3 as soon as a malfunction of the control device 1 or of the power transistor 3 is announced, and therefore of not damaging the power stage 2 and the power transistor 3.

The invention claimed is:

1. A power stage comprising a control device and a power transistor connected to the control device in order to be driven by the control device, the control device comprising:
   a primary circuit and a secondary circuit, the primary circuit comprising:
   a control module able to generate a control current it, wherein the control module comprises an oscillator able to generate a predefined pulsed wave based on a control signal originating from outside the power stage and a full bridge, connected to the oscillator, able to generate the control current it on the basis of the predefined pulsed wave in a direction of the primary winding of the pulse transformer,
   a primary circuit malfunction detector able to detect a malfunction of the primary circuit, wherein the primary circuit malfunction detector is configured to detect an overcurrent in the primary circuit,
   a pulse transformer comprising a primary winding connected to the primary circuit, the pulse transformer comprising a secondary winding connected to the secondary circuit, magnetically coupled to the primary winding and able to generate, from the control current $i_t$, an induced pulse current $i_m$ in the direction of the secondary circuit, the induced pulse current $i_m$ making it possible to drive the power transistor,
   the secondary circuit comprising:
   a power and fault detection controller, connected to the secondary winding of the pulse transformer and to the power transistor, able to detect a malfunction of the secondary circuit and/or of the power transistor,
the power and fault detection controller being able to communicate the malfunction of the secondary circuit and/or of the power transistor to the primary circuit malfunction detector.

2. The power stage according to claim 1, wherein the power and fault detection controller communicates the malfunction of the secondary circuit and/or of the power transistor to the primary circuit malfunction detector only by way of the pulse transformer.

3. The power stage according to claim 1, wherein the full bridge is configured to synchronously generate the control current $i_t$ based on the control signal and/or the predefined pulsed wave.

4. The power stage according to claim 1, the secondary winding comprising two electrical terminals, the power and fault detection controller comprising an impedance R connected to the two electrical terminals of the secondary winding of the pulse transformer, the impedance R comprising an electrical resistance of less than 1000 ohms.

5. The power stage according to claim 1, wherein the primary circuit malfunction detector is able to detect an opening fault in the primary circuit and/or a short-circuit fault in the primary circuit.

6. The power stage according to claim 1, wherein the power and fault detection controller comprises a pulse detector able to detect a pulse fault in the induced pulse current $i_m$.

7. The power stage according to claim 6, wherein the pulse detector is configured to rectify the induced pulse current $i_m$.

8. The power stage according to claim 1, wherein the power and fault detection controller comprises a power transistor operation detector, able to detect at least one parameter of the power transistor causing non-nominal operation of the power transistor.

9. The power stage according to claim 1, wherein the power and fault detection controller comprises a stop element able to short-circuit the pulse transformer on the basis of a fault detection.

10. The power stage according to claim 1, comprising a power transistor driver able to generate a command for the power transistor based on the induced pulse current $i_m$.

11. The power stage according to claim 10, wherein the power transistor driver comprises a command deactivator, configured to cancel the command for the power transistor when a primary circuit malfunction and/or secondary circuit malfunction and/or power transistor malfunction is detected.

12. The power stage according to claim 1, wherein the primary circuit malfunction detector comprises a recorder able to record the malfunction of the primary circuit and/or the malfunction of the secondary circuit and/or of the power transistor.

* * * * *

UNITED STATES PATENT AND TRADEMARK OFFICE
CERTIFICATE OF CORRECTION

PATENT NO. : 12,341,499 B2  
APPLICATION NO. : 17/864278  
DATED : June 24, 2025  
INVENTOR(S) : Francis Abdesselam Page 1 of 1

It is certified that error appears in the above-identified patent and that said Letters Patent is hereby corrected as shown below:

In the Claims

In Claim 1, Column 9, Line 23, "a control current it," should be -- a control current $i_t$, --.
In Claim 1, Column 9, Line 28, "the control current it," should be -- the control current $i_t$, --.

Signed and Sealed this  
Twelfth Day of August, 2025

Coke Morgan Stewart  
*Acting Director of the United States Patent and Trademark Office*